(12) United States Patent
Sunaga et al.

(10) Patent No.: US 12,484,201 B2
(45) Date of Patent: Nov. 25, 2025

(54) ELECTRIC DEVICE WITH IMMERSED ELECTRONIC COMPONENTS AND ELONGATED BUSBAR FORMING AN UPWARD FLOW

(71) Applicants: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(72) Inventors: Takahiro Sunaga, Mie (JP); Hideyuki Kuboki, Mie (JP); Masayoshi Hirota, Mie (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(*) Notice: Subject to any disclaimer, the term of this patent is extended or adjusted under 35 U.S.C. 154(b) by 271 days.

(21) Appl. No.: 18/013,950

(22) PCT Filed: Jun. 17, 2021

(86) PCT No.: PCT/JP2021/022971
§ 371 (c)(1),
(2) Date: Dec. 30, 2022

(87) PCT Pub. No.: WO2022/004400
PCT Pub. Date: Jan. 6, 2022

(65) Prior Publication Data
US 2023/0292473 A1 Sep. 14, 2023

(30) Foreign Application Priority Data
Jul. 3, 2020 (JP) .................................. 2020-115388

(51) Int. Cl.
*H05K 7/20* (2006.01)
*H05K 5/04* (2006.01)
*H05K 7/14* (2006.01)

(52) U.S. Cl.
CPC ........... *H05K 7/20927* (2013.01); *H05K 5/04* (2013.01); *H05K 7/14329* (2022.08); *H05K 7/20236* (2013.01); *H05K 7/20872* (2013.01)

(58) Field of Classification Search
CPC ............. H05K 7/1432; H05K 7/14329; H05K 7/20236; H05K 7/20845; H05K 7/203;
(Continued)

(56) References Cited

U.S. PATENT DOCUMENTS 6,052,284 A * 4/2000 Suga ..................... H01L 23/473
361/689
8,369,090 B2 * 2/2013 Chester .................... G06F 1/20
165/80.4
(Continued)

FOREIGN PATENT DOCUMENTS

| JP | 60-249351 | 12/1985 |
|---|---|---|
| JP | 62-085449 | 4/1987 |

(Continued)

OTHER PUBLICATIONS

International Search Report issued in International Bureau of WIPO Patent Application No. PCT/JP2021/022971, dated Aug. 31, 2021, along with an English translation thereof.

*Primary Examiner* — Jayprakash N Gandhi
*Assistant Examiner* — Steven Ngo
(74) *Attorney, Agent, or Firm* — Greenblum & Bernstein, P.L.C.

(57) ABSTRACT

An electric device includes a case, a circuit substrate that is disposed in the case, and electronic components that are disposed in the case, and generate heat when energized. The
(Continued)

case is filled with a liquid insulating-and-cooling medium, the circuit substrate is disposed in an orientation in which the normal lines of the substrate surfaces that are the plate surfaces of the circuit substrate are horizontal, the electronic components are disposed on the lower side of the case, and at least some of the electronic components are immersed in the liquid insulating-and-cooling medium.

8 Claims, 3 Drawing Sheets

(58) Field of Classification Search
CPC ........... H05K 7/20872; H05K 7/20927; H05K 7/20936; H05K 5/04; H05K 2201/10272; H01H 9/52; H01H 1/62; H01L 23/34–4735; H02G 5/06; H02G 5/10
See application file for complete search history.

(56) References Cited

U.S. PATENT DOCUMENTS

| | | | |
|---|---|---|---|
| 2017/0345799 A1* | 11/2017 | Rowden | ................ H01L 25/072 |
| 2019/0383559 A1 | 12/2019 | Aoki et al. | |
| 2020/0045846 A1* | 2/2020 | De Jaegere | ............ H02G 3/088 |
| 2020/0051765 A1 | 2/2020 | Hiramitsu et al. | |

FOREIGN PATENT DOCUMENTS

| | | |
|---|---|---|
| JP | 62-293653 | 12/1987 |
| JP | 2017-147881 | 8/2017 |
| JP | 2019-220527 | 12/2019 |
| JP | 2020-088090 | 6/2020 |

* cited by examiner ively large. If
ELECTRIC DEVICE WITH IMMERSED ELECTRONIC COMPONENTS AND ELONGATED BUSBAR FORMING AN UPWARD FLOW

TECHNICAL FIELD

The present disclosure relates to an electric device.

BACKGROUND ART

Heretofore, a DC-DC converter apparatus or the like that converts an input DC voltage into a DC voltage at a predetermined level, and outputs the resultant DC voltage is known as an example of an electric device. The DC-DC converter apparatus is mounted in a vehicle such as an electric automobile or a hybrid automobile. Electronic components that are used for an electric device such as a DC-DC converter apparatus are heat-generating components that generate heat when energized, and the amounts of heat the electronic components generate are also relatively large. If heat generated by an electronic component is confined in the case of the electric device, there is the possibility that the temperature in the case will increase to a high temperature, and the performance of the electronic component will decrease.

In view of this, for example, Patent Document 1 below discloses a cooling device for an electric power conversion device that has a configuration in which a heat generating component (electronic component) is connected to a heat-dissipation-part forming member via a heat spreader or an insulation layer, and cooling water is circulated through a waterway in the heat-dissipation-part forming member so as to cool the heat generating component.

CITATION LIST

Patent Documents

Patent Document 1: JP 2020-088090A

SUMMARY OF INVENTION

Technical Problem

In recent years, there has been a demand for a decrease in the size of an electric device that is used for an electric automobile or a hybrid automobile. When a decrease in the size of an electronic component results in a reduced heat-dissipation area, the temperature of the electronic component itself is likely to be higher than a conventional electronic component, and the temperature in the electric device locally increases. When the temperature in the electric device is locally high, there is the possibility that nearby electronic components and circuits will be thermally affected, and there is concern that a failure will occur.

A technique disclosed in the present specification was accomplished based on the aforementioned circumstances, and an object of the present invention is to provide an electric device in which a local temperature increase is suppressed.

Solution to Problem

An electric device according to the present disclosure includes: a case, a circuit substrate that is disposed in the case, and at least one electronic component that is disposed in the case, and generates heat when energized, the case is filled with a liquid insulating-and-cooling medium, the circuit substrate is disposed in an orientation in which a normal line of a substrate surface that is a plate surface of the circuit substrate is horizontal, the electronic component is disposed on a lower side of the case, and at least a portion of the electronic component is immersed in the liquid insulating-and-cooling medium.

Advantageous Effects of Invention

According to the present disclosure, it is possible to provide an electric device in which a local temperature increase is suppressed.

EMBODIMENTS OF THE INVENTION

Description of Embodiments of Present Disclosure

Figure 1:
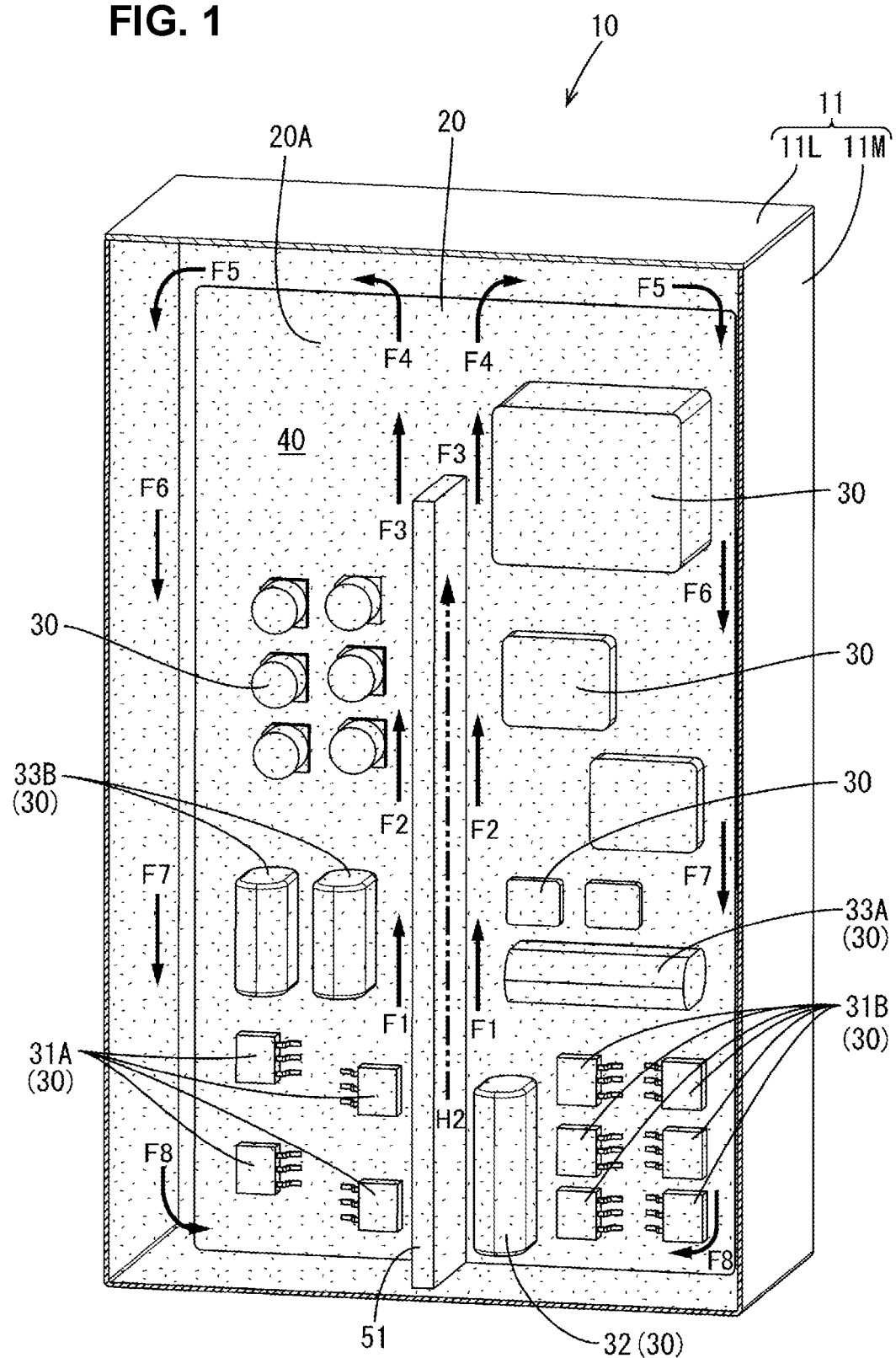
FIG. 1 is a perspective view schematically showing an internal configuration of a case of an electric device according to an embodiment of the present invention.

Firstly, embodiments of the present disclosure will be listed and described.

(1) An electric device according to the present disclosure includes: a case, a circuit substrate that is disposed in the case, and at least one electronic component that is disposed in the case, and generates heat when energized, the case is filled with a liquid insulating-and-cooling medium, the circuit substrate is disposed in an orientation in which a normal line of a substrate surface that is a plate surface of the circuit substrate is horizontal, the electronic component is disposed on a lower side of the case, and is immersed in the liquid insulating-and-cooling medium.

With the configuration in the above (1), a live part (heat generating part) of the electronic component is directly cooled by the liquid insulating-and-cooling medium. Heat dissipated from the electronic component disposed on the lower side of the case is transferred to the liquid insulating-and-cooling medium, and the heated liquid insulating-and-cooling medium rises along the substrate surface of the circuit substrate. Accordingly, natural convection of the liquid insulating-and-cooling medium occurs in the case, heat is distributed in the case, and a local temperature increase in the electric device is suppressed. Note that, in the above description, it is sufficient that at least a portion of the electronic component is immersed in the liquid insulating-and-cooling medium, and, if a plurality of electronic components are included, it is sufficient that at least one electronic component is disposed on the lower side of the case.

(2) Preferably, the electric device according to the present disclosure includes a plurality of electronic components, and the electronic components are mounted on one substrate surface and the other substrate surface, namely both of the two substrate surfaces.

With the configuration in the above (2), as a result of the electronic components being mounted on both of the two plate surfaces of the circuit substrate, the area of the circuit substrate required for mounting the plurality of electronic components is reduced compared with a configuration where electronic components are mounted only on one substrate surface. Accordingly, it is possible to reduce the size of the circuit substrate and therefore the size of the electric device while suppressing an increase in the mounting density of the electronic components.

(3) Preferably, a content of dust particles per unit volume of the liquid insulating-and-cooling medium is lower than a content of dust particles per unit volume of air.

There is the possibility that a failure will occur in the electric device due to dust particles floating in the case of the electric device, which causes short-circuiting between live parts of electronic components such as electronic components disposed in the case. In order to avoid the occurrence of a failure, it has been necessary to set the distance between electronic components to a long distance (to set a low mounting density), which poses an obstacle to decreasing the size of the electric device. With the configuration in the above (3), the amount of dust particles floating in the case is reduced compared with a conventional configuration in which a case is not filled with a liquid insulating-and-cooling medium, and the probability of the occurrence of short-circuiting caused by dust particles is decreased. Accordingly, it is possible to increase the mounting density of electronic components, and reduce the size of an electric device, compared with a conventional configuration.

(4) Preferably, the case is made of a material that contains a metal.

With the configuration in the above (4), the case has high heat conductivity, and, as a result, heat transferred from an electronic component to the liquid insulating-and-cooling medium is likely to be transferred from the liquid insulating-and-cooling medium to the case, and be further transferred to the outside.

Accordingly, the heat dissipation of the electric device is improved, and an increase in temperature is suppressed.

(5) Preferably, a flow path through which the liquid insulating-and-cooling medium is able to flow is formed between the case and the electronic component.

With the configuration in the above (5), the liquid insulating-and-cooling medium flows between the case and the electronic component, and, as a result, the liquid insulating-and-cooling medium is favorably convected in the case, and the thermal dispersion is improved. Moreover, as a result of the liquid insulating-and-cooling medium flowing along the case, heat is likely to be transferred from the liquid insulating-and-cooling medium to the case, thus improving the heat dissipation. Accordingly, an increase in temperature in the electric device is suppressed.

(6) Preferably, the electric device according to the present disclosure further includes a busbar formed in a flat-plate shape and containing a metal, and the busbar and the electronic component are connected to each other via a metal member formed containing a metal.

With the configuration in the above (6), heat from the electronic component is transferred to the busbar via the metal member that has high heat conductivity. The heat transferred to the busbar is then transferred from a surface of the busbar that has a large specific surface area, to the liquid insulating-and-cooling medium that is in contact with this surface. Accordingly, heat from the electronic component is promptly transferred to the liquid insulating-and-cooling medium, thus improving the thermal dispersion and the heat dissipation of the electric device.

(7) Preferably, the busbar has an elongated shape that is long in one direction, and is disposed such that a longitudinal direction thereof matches a vertical direction.

With the configuration in the above (7), heat transferred to the busbar is transferred upward from below as well as inside the busbar that has high heat conductivity, and is distributed. Accordingly, the thermal dispersion in the electric device is further improved.

(8) Preferably, the busbar is disposed in an orientation in which a plate surface of the busbar is perpendicular to the substrate surface of the circuit substrate.

With the configuration in the above (8), the liquid insulating-and-cooling medium flows along the substrate surface of the circuit substrate and the plate surface of the busbar, and the flow of the liquid insulating-and-cooling medium is corrected. Accordingly, convection of the liquid insulating-and-cooling medium in the case 11 is smoother, thus improving the thermal dispersion and the heat dissipation of the electric device.

DETAILED DESCRIPTION OF EMBODIMENTS OF PRESENT DISCLOSURE

The following describes embodiments of the present disclosure. The present invention is not limited to these examples, and is defined by the claims, and all changes that come within the meaning and range of equivalency of the claims are intended to be embraced therein.

EMBODIMENTS

Figure 2:
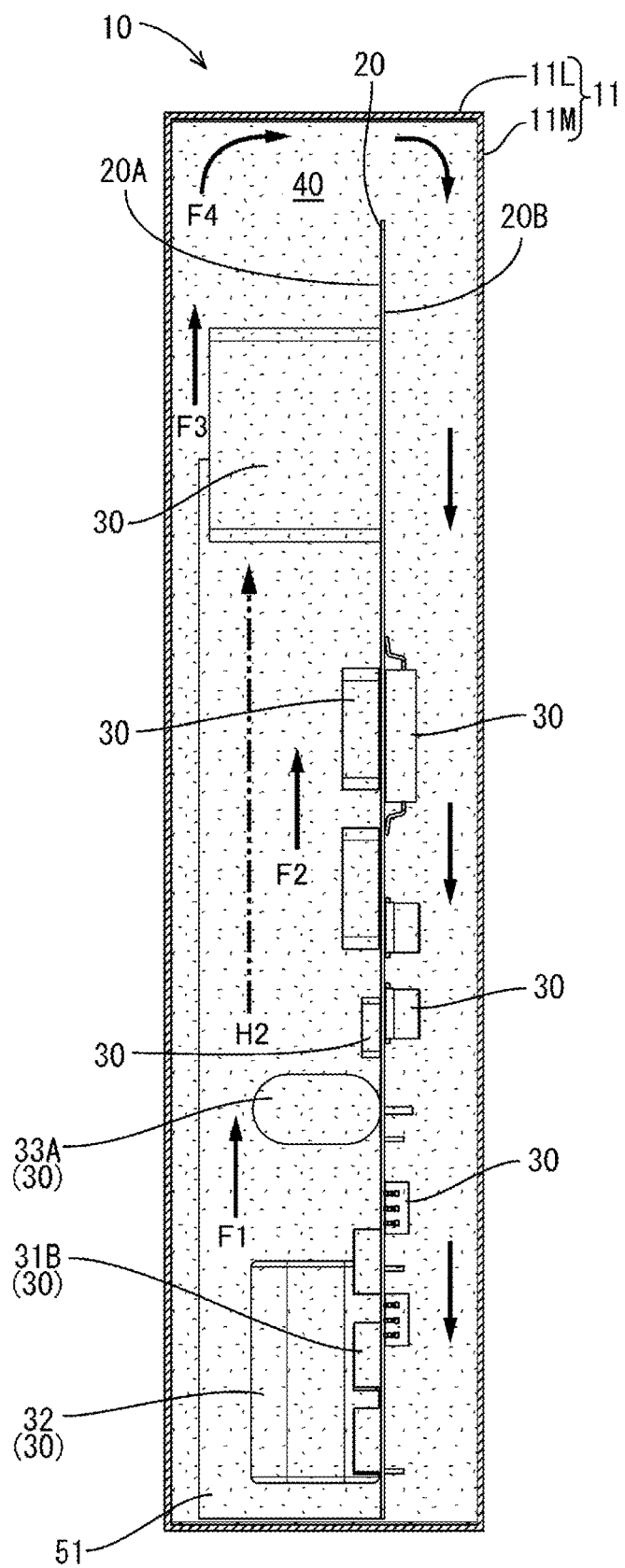
FIG. 2 is a side view schematically showing the internal configuration of the case of the electric device.
Figure 3:
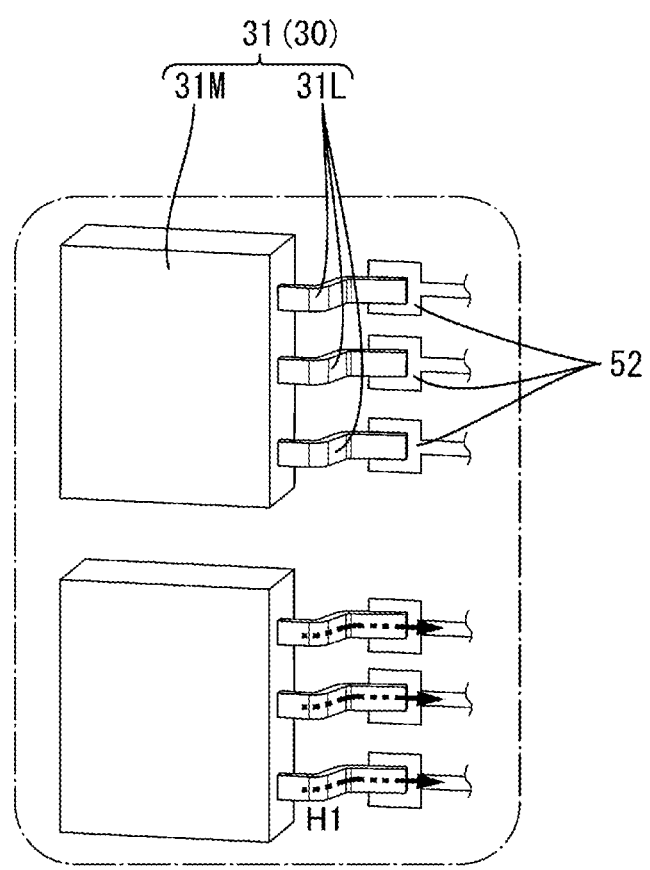
FIG. 3 is a perspective view showing an example of a mounting mode of an electronic component.

Embodiments of the present disclosure will be described with reference to FIGS. 1 to 3. The following description is given assuming that the upper side in FIGS. 1 and 2 is defined as an upward direction, the left side of FIG. 2 that corresponds to the front side of FIG. 1 is the front side, and the far side of FIG. 2 that corresponds to the left side on the rear side of FIG. 1 is the left side. Note that reference numerals may be given to only some of a plurality of the same members, and be omitted for the other members.

Electric Device 10

In the present embodiment, an electric device 10 that is mounted in a vehicle such as an automobile will be illustrated. The electric device 10 is a device that includes a switching DC-DC converter (DC voltage conversion apparatus) that converts an input DC voltage into a DC voltage at a predetermined level, and outputs the resultant DC voltage, and has a known circuit configuration. The circuit configuration according to the present embodiment is not particularly limited, but includes a first converter that converts a DC voltage into an AC voltage, a transformer (voltage inverter) that transforms an AC voltage, and a second converter that converts an AC voltage into a DC voltage, as well as a rectifier circuit that rectifies an output voltage, a resonant circuit, a smoothing circuit, and the like. The transformer may be a transformer that steps up or steps down a voltage, but the electric device 10 according to the present embodiment includes a step-down converter that steps down a voltage using the transformer. In the following description, a switching element for the first converter may be referred to as a high-voltage side switching element, and a switching element for the second converter may be referred to as a low-voltage side switching element.

As shown in FIGS. 1 and 2, the electric device 10 according to the present embodiment includes a case 11 and a circuit substrate 20 disposed in the case 11. Electronic components 30 are attached to the circuit substrate 20, and the case 11 is filled with a liquid insulating-and-cooling medium 40. The electric device 10 is mounted in a vehicle in an orientation shown in FIGS. 1 and 2, in other words an orientation in which a normal line of substrate surfaces 20A and 20B of the circuit substrate 20 is horizontal.

Case 11

As shown in FIGS. 1 and 2, the case 11 includes a main body 11M that is shaped as a deep rectangular parallelepiped box, and is open upward, and a lid body 11L that closes the opening on the upper side of the main body 11M. The main body 11M and the lid body 11L are made of a material that includes a metal such as aluminum or stainless steel. Of these, the main body 11M and the lid body 11L are preferably made of a material containing a metal that has high heat conductivity such as aluminum or an aluminum alloy, and, in some cases, stainless steel whose surface has been plated with copper or nickel may be used. If a copper alloy or a material that has been subjected to copper plating is used for the lid body 11L that has a relatively small surface area, the lid body 11L may function as a heatsink.

The main body 11M includes a rectangular bottom wall and four side walls that stand upright from the peripheral edges of the bottom wall, which are integrally formed to a size large enough to house the circuit substrate 20. Preferably, the lid body 11L can close the opening of the main body 11M in a watertight manner.

Circuit Substrate 20

As shown in FIGS. 1 and 2, the circuit substrate 20 shaped as a flat rectangular plate is housed in the case 11. The circuit substrate 20 is a flat plate-like member that has a known configuration in which conductive paths are formed on a mounting surface of an insulation board made of an insulation material using a printed wiring technique, for example. The conductive paths are made of a material that contains a metal such as copper. In the electric device 10, the circuit substrate 20 is disposed in the case 11, in an orientation in which the normal lines of the substrate surfaces 20A and 20B that are plate surfaces of the circuit substrate 20 are horizontal. In other words, the circuit substrate 20 is housed in the case 11, in a so-called vertical orientation in which the substrate surfaces 20A and 20B extend in the vertical direction.

As shown in FIG. 1, in the present embodiment, a gap (flow path) through which the liquid insulating-and-cooling medium 40 can flow is formed between an inner surface of the main body 11M or the lid body 11L and each of the left edge, right edge, and upper edge of the circuit substrate 20 housed in the case 11. As shown in FIG. 2, in the circuit substrate 20, one substrate surface, namely the substrate surface 20A, and the other substrate surface, namely the substrate surface 20B, serve as mounting surfaces, and electronic components 30 are mounted on both of the substrate surfaces 20A and 20B of the circuit substrate 20. In addition, as shown in FIGS. 1 and 2, a busbar 51 extends vertically at the central position in the right-left direction of the substrate surface 20A.

Electronic Component 30

As shown in FIGS. 1 and 2, various electronic components 30 are mounted on the substrate surfaces 20A and 20B of the circuit substrate 20. As shown in FIGS. 1 and 2, gaps through which the liquid insulating-and-cooling medium 40 can flow are formed between the electronic components 30 mounted on each of the substrate surfaces 20A and 20B and the inner surfaces of the main body 11M of the case 11. The electronic components 30 include a resistor, a coil, a capacitor, a fuse, a relay, a diode, an IC (Integrated Circuit), a switching element such as an FET (Field Effect Transistor), and the like. More specifically, as shown in FIGS. 1 and 2, high-voltage side FETs 31A that are high-voltage side switching elements, low-voltage side FETs 31B that are low-voltage side switching elements, a transformer 32, a resonance coil 33A constituting the resonant circuit, choke coils 33B, and the like are included.

The electronic components 30 are disposed on the lower side in the case 11. As shown in FIGS. 1 and 2, the electric device 10 according to the present embodiment includes a plurality of electronic components 30, and the plurality of electronic components 30 are mounted at lower positions of the substrate surfaces 20A and 20B as a whole. If the electric device 10 includes a plurality of electronic components 30, at least one electronic component 30 is positioned below ½ of the inner height of the case 11 in the up-down direction, preferably ⅓, and more preferably ¼. As a result of electronic components 30 that are heat-generating components being disposed on the lower side in the case 11 in this manner, the liquid insulating-and-cooling medium 40 positioned on the lower side in the case 11 is heated by heat generated by the electronic components 30 when energized, and rises, and convection of the liquid insulating-and-cooling medium 40 is likely to occur, thus improving thermal dispersion. In the present embodiment, the high-voltage side FETs 31A, the low-voltage side FETs 31B, and the transformer 32 that includes a plurality of coils are disposed at the lowermost portions in the case 11. Note that, in the present embodiment, as shown in FIG. 1, four high-voltage side FETs 31A, six low-voltage side FETs 31B, one transformer, one resonance coil 33A, and two choke coils 33B are mounted on the substrate surface 20A.

Switching elements and coils from among the various electronic components 30 included in the electric device 10 that is a DC-DC converter generate particularly large amounts of heat when energized, and are relatively small. If the amount of heat generated by all of the electronic components 30 when energized is 100%, there are cases where the total amount of heat generated by the four high voltage side FETs 31A accounts for 25% or more, the total amount of heat generated by the six low-voltage side FETs 31B accounts for 15% or more, the amount of heat generated by the transformer 32 accounts for 15% or more, the total amount of heat generated by the two resonance coils 33A accounts for 10% or more, and the total amount of heat generated by the above four types of electronic components 30 accounts for 70% or more, depending on the circuit configuration of the DC-DC converter. In the present embodiment, three types of electronic components 30 (the high-voltage side FETs 31A, the low-voltage side FETs 31B, and the transformer 32) that generate the largest amount of heat are disposed in the lowermost portions of the case 11, and the resonance coil 33A and the choke coils 33B that generate the second largest amount of heat to the above three types of electronic components 30 are disposed at positions immediately above them. Accordingly, in the case 11, the amount of heat generated by the electronic components 30 when the electric device 10 is energized decreases significantly upward from below (the difference in the amount of heat generation between the lower side and the upper side increases).

Each electronic component 30 is mounted on the substrate surface 20A or the substrate surface 20B that are mounting surfaces of the circuit substrate 20, using a well-known technique such as soldering, in a known mode, and is electrically connected to a conductive path made of a material that contains a metal, on the substrate surface 20A or 20B. As an example, FIG. 3 shows a mounting mode of an FET 31 that constitutes a high-voltage side FET 31A or a low-voltage side FET 31B. As shown in FIG. 3, the FET 31 includes main body portions 31M in which an element is incorporated, and terminal portions 31L protruding outward from the main body portions 31M. FIG. 3 shows a three-terminal FET 31 from which three terminal portions 31L protrude, but the shape of the FET 31 is not limited to such a shape. As shown in FIG. 3, lands 52 are provided on some of the conducting paths extending throughout the substrate surface 20A and the substrate surface 20B, and protruding ends of the terminal portions 31L are connected to the respective lands 52 through soldering or the like. Note that the busbar 51 to be described later is electrically connected to the conductive paths formed on the substrate surface 20A, and the electronic components 30 and the busbar 51 that are mounted on the substrate surface 20A are connected to each other via the conductive paths that include the lands 52 formed containing a metal.

Liquid Insulating and Cooling Medium 40

As shown in FIGS. 1 and 2, the case 11 is filled with the liquid insulating-and-cooling medium 40. In the present embodiment, the liquid insulating-and-cooling medium 40 fills the case 11 such that the entire circuit substrate 20 is immersed. The liquid insulating-and-cooling medium 40 does not need to fill the entire case 11, and it suffices for an electronic component 30 to be immersed in the liquid insulating-and-cooling medium 40. If a plurality of electronic components 30 are disposed, it suffices for some of the electronic components 30 to be immersed, but it is preferable that at least switching elements and coils that generate large amounts of heat and are disposed on the lower side of the case are immersed, and it is further preferable that all of the electronic components 30 are immersed.

The liquid insulating-and-cooling medium 40 is a liquid cooling medium that has no electrical conductivity. Perfluorocarbon, hydrofluoroether, hydrofluoroketone, or a fluorine-based inert liquid can be used as the liquid insulating-and-cooling medium 40, for example. Specifically, examples of the liquid insulating-and-cooling medium 40 include Novec® manufactured by 3M Japan Limited, Fluorinert®, Galden® manufactured by Solvay S.A. and the like. In consideration of the environmental impact and the like, it is particularly preferable to use hydrofluoroether-based Novec. By immersing an electronic component 30 in the liquid insulating-and-cooling medium 40, a live part of the electronic component 30 is directly cooled by the liquid insulating-and-cooling medium 40.

In the present embodiment, a liquid insulating-and-cooling medium with a lower content of dust particles per unit volume than the content of dust particles per unit volume of air is used as the liquid insulating-and-cooling medium 40. It is preferable to use the liquid insulating-and-cooling medium 40 with a lower content of dust particles having a particle diameter of 100 nm or larger, more specifically, 1000 nm or larger, than that of air, for example. Note that the above-mentioned air is gas considered to be usually present in the vicinity of an electronic component 30 when the electronic component 30 is not immersed in the liquid insulating-and-cooling medium 40. When dust particles adhere to the live part of the electronic component 30, there is the possibility that short-circuiting will occur due to tracking. Using the liquid insulating-and-cooling medium 40 with a lower content of dust particles per unit volume than that of air reduces the distance between live parts required for avoiding short-circuiting. Thus, it is possible to reduce the distance between electronic components 30, and to reduce the size of the electric device 10.

In addition, in the present embodiment, a liquid insulating-and-cooling medium that has a higher dielectric strength voltage than air is used as the liquid insulating-and-cooling medium 40. While the dielectric strength voltage of air is about 3 kV/mm, the dielectric strength voltage of Novec is about 16 kV/mm, for example. Using the liquid insulating-and-cooling medium 40 that has a higher dielectric strength voltage than that of air reduces the distance between live parts required for avoiding short-circuiting. Thus, it is possible to reduce the size of the electric device 10 by reducing the creeping distance between electronic components 30, that is to say, increasing the mounting density of the electronic components 30 on the circuit substrate 20.

Busbar 51

As shown in FIGS. 1 and 2, the busbar 51 is disposed on the substrate surface 20A of the circuit substrate 20. The busbar 51 is a conductive member formed into a flat-plate shape that is elongated in one direction, by performing press molding or a forming process on a metal plate member. In the present embodiment, the busbar 51 that is made of a material containing copper, and has very high heat conductivity is used. As shown in FIGS. 1 and 2, the longitudinal direction of the busbar 51 matches the up-down direction, and the busbar 51 is disposed on the substrate surface 20A such that the plate-like surfaces thereof are perpendicular to the substrate surface 20A, and is electrically connected to the conductive paths formed on the substrate surface 20A. Accordingly, as described above, the busbar 51 and each electronic component 30 are connected via a metal member such as a conductive path that includes a land 52. Note that, as shown in FIG. 2, in a state of being disposed on the substrate surface 20A, a gap through which the liquid insulating-and-cooling medium 40 can flow is formed between a front edge of the busbar 51 and the inner surface of the front wall of the main body 11M of the case 11.

As shown in FIG. 1, in the present embodiment, the busbar 51 is disposed at the central portion in the right-left direction of the substrate surface 20A, and is positioned between the high-voltage side FETs 31A and the choke coils 33B, and the low-voltage side FETs 31B, the transformer 32, and the resonance coil 33A, which are mounted on the substrate surface 20A. Accordingly, a plurality of electronic components 30 that generate particularly large amounts of heat are disposed in a state of being separated between left and right sides relative to the busbar 51, on the substrate surface 20A.

Heat Distribution and Heat Dissipation in Electric Device 10

Next, an example of heat distribution and heat dissipation in the electric device 10 according to the present embodiment will be described.

When energization of the electric device 10 is started, the electronic components 30 immersed in the liquid insulating-and-cooling medium 40 in the case 11 generate heat. Particularly large amounts of heat are generated by the high-voltage side FETs 31A, the low-voltage side FETs 31B, and the transformer 32 disposed in the lowermost portions of the case 11, as shown in FIGS. 1 and 2. Heat generated by these electronic components 30 is transferred to the liquid insulating-and-cooling medium 40 that is in contact with the live parts and the like thereof. The temperature of the liquid insulating-and-cooling medium 40 to which the heat has transferred increases, the specific gravity thereof decreases, and thus the liquid insulating-and-cooling medium 40 rises as indicated by the arrows F1. The liquid insulating-and-cooling medium 40 further rises along the busbar 51 as indicated by the arrows F2 and F3. When the liquid insulating-and-cooling medium 40 that has risen while affecting the surrounding liquid insulating-and-cooling medium 40 and forming an upward flow arrives at a position near the liquid surface on the uppermost side (in the present embodiment, the lower surface of the lid body 11L of the case 11), it moves to left and right end portions of the case 11 along the liquid surface (lower surface of the lid body 11L) as indicated by arrows F4 and F5.

The heat of the liquid insulating-and-cooling medium 40 that has reached the lower surface of the lid body 11L is transferred to the lid body 11L that is made of a material containing a metal and has high heat conductivity, and is dissipated from the upper surface of the lid body 11L to the outside of the case 11. Accordingly, the temperature of the liquid insulating-and-cooling medium 40 decreases, the specific gravity of the liquid insulating-and-cooling medium 40 increases, and thus the liquid insulating-and-cooling medium 40 moves downward along the side walls of the main body 11M of the case 11 as indicated by the arrows F6 and F7. The liquid insulating-and-cooling medium 40 moving downward affects the surrounding liquid insulating-and-cooling medium 40 and forms a downward flow. The main body 11M is also made of a material containing a metal and has high heat conductivity, and thus the heat of the liquid insulating-and-cooling medium 40 is transferred to the side walls of the main body 11M, and is dissipated from the outer surfaces of the side walls to the outside of the case 11. Accordingly, the temperature of the liquid insulating-and-cooling medium 40 further decreases.

The liquid insulating-and-cooling medium 40 that has moved to the bottom wall of the main body 11M moves along lower walls as indicated by the arrows F8, and flows in the vicinity of electronic components 30. The liquid insulating-and-cooling medium 40 flowing into the vicinity of the high-voltage side FETs 31A, the low-voltage side FETs 31B, and the transformer 32 disposed at the lowermost portions dissipates heat to the outside of the case 11 via the lid body 11L, the side walls of the main body 11M, and the like, and thus the temperature of the liquid insulating-and-cooling medium 40 decreases. The liquid insulating-and-cooling medium 40 whose temperature has decreased in this manner comes into contact with the electronic components 30 that generate large amounts of heat, such as the high-voltage side FETs 31A, the low-voltage side FETs 31B, the transformer 32, and the like, and thereby heat generated by these electronic components 30 is transferred to the liquid insulating-and-cooling medium 40 again. The liquid insulating-and-cooling medium 40 to which heat from the electronic components 30 has been transferred rises again as indicated by the arrows F1. Note that, also on the substrate surface 20B side, convection of the liquid insulating-and-cooling medium 40 occurs in accordance with heat generated by the electronic components 30.

As shown in FIGS. 1 and 2, in the case 11, a gap through which the liquid insulating-and-cooling medium 40 can flow is formed between each of the left edge, right edge, and upper edge of the circuit substrate 20 and an inner surface of the main body 11M or the lid body 11L. In addition, a gap through which the liquid insulating-and-cooling medium 40 can flow is also formed between an inner surface of the main body 11M of the case 11 and electronic components 30 mounted on each of the substrate surfaces 20A and 20B. Furthermore, in a state where the busbar 51 is disposed on the substrate surface 20A, a gap through which the liquid insulating-and-cooling medium 40 can flow is also formed between the front edge of the busbar 51 and the inner surface of the front wall of the main body 11M of the case 11. Thus, in addition to the general flows such as those described above, the liquid insulating-and-cooling medium 40 can flow relatively freely, through these gaps, throughout the entire case 11 that includes the substrate surface 20A side and the substrate surface 20B side.

In this manner, the liquid insulating-and-cooling medium 40 is convected in the case 11 while directly cooling the live parts of the electronic components 30, and, as a result, heat is distributed in the electric device 10, and is dissipated to the outside of the case 11 via the lid body 11L, the side walls of the main body 11M, and the like.

Furthermore, in the present embodiment, heat generated by the electronic components 30 is also distributed through a route that extends through a metal member having high heat conductivity such as conductive paths that include the lands 52 made of a material containing a metal. As indicated by the dash double-dot line arrows H1 in FIG. 3, for example, heat generated by the FETs 31 is transferred from the terminal portions 31L to the lands 52. The heat is then transferred to the conductive paths that include the lands 52 formed on the substrate surface 20A, and is further transferred to the busbar 51 connected to the conductive paths. As indicated by the dash double-dot line arrow H2 in FIGS. 1 and 2, heat transferred to the busbar 51 moves upward inside the busbar 51. The busbar 51 formed in a flat-plate shape has a large specific surface area, and the liquid insulating-and-cooling medium 40 is in contact with the surfaces thereof, and thus heat inside the busbar 51 is transferred from the surfaces of the busbar 51 to the liquid insulating-and-cooling medium 40 while moving upward from below along the longitudinal direction of the busbar 51. The liquid insulating-and-cooling medium 40 to which heat has been transferred from the busbar 51, whose temperature has increased, and whose specific gravity has decreased rises along the busbar 51 as indicated by the arrow lines F1, F2, and F3. Accordingly, convection of the liquid insulating-and-cooling medium 40 that is similar to that described above occurs, and heat is distributed in the electric device 10. The heat of the liquid insulating-and-cooling medium 40 is then dissipated to the outside of the case 11 via the lid body 11L, the side walls of the main body 11M, and the like.

As described above, the electric device 10 has very high thermal dispersion and heat dissipation while having a simple structure.

Actions and Effects of Embodiment

Actions and effects of the present embodiment will be described again.

The electric device 10 according to the present embodiment includes the case 11, the circuit substrate 20 that is disposed in the case 11, and at least one electronic component 30 that is disposed in the case 11, and generates heat when energized, the case 11 is filled with the liquid insulating-and-cooling medium 40, the circuit substrate 20 is disposed in an orientation in which the normal lines of the substrate surfaces 20A and 20B that are plate surfaces of the circuit substrate 20 are horizontal, and the electronic component 30 is disposed on the lower side of the case 11, and is immersed in the liquid insulating-and-cooling medium 40.

With the configuration according to the present embodiment, a live part of the electronic component 30 can be directly cooled by the liquid insulating-and-cooling medium 40. Heat dissipated from an electronic component 30 disposed on the lower side of the case 11 is transferred to the liquid insulating-and-cooling medium 40, and the heated liquid insulating-and-cooling medium 40 rises along the substrate surfaces 20A and 20B of the circuit substrate 20. Accordingly, natural convection of the liquid insulating-and-cooling medium 40 occurs in the case 11, and heat is distributed inside the case 11, thus suppressing a local temperature increase in the electric device 10. As a result, it is possible to reduce the mounting interval between electronic components 30, and to reduce the size of the electric device 10.

Note that the above-described electronic components 30 each include a semiconductor switching element such as the FET 31. In addition, the above-described electronic components 30 include an element such as the transformer 32 that has a coil, and the coil 33. Among the electronic components 30 that are used for the electric device 10, a semiconductor switching element such as the FET 31, the transformer 32, and the coil 33 generate large amounts of heat. These electronic components 30 are immersed in the liquid insulating-and-cooling medium 40, and are collectively disposed on the lower side in the case 11, and, as a result, in the case 11, natural convection of the liquid insulating-and-cooling medium 40 is likely to occur, and it is possible improve the thermal dispersion, and to effectively suppress a local temperature increase.

The electric device 10 according to the present embodiment includes a plurality of electronic components 30, and the electronic components 30 are mounted on one substrate surface 20A and the other substrate surface 20B, that is to say both of the substrate surfaces 20A and 20B.

With the configuration according to the present embodiment, as a result of the electronic components being mounted on the two plate surfaces of the circuit substrate 20, the area of the circuit substrate 20 required for mounting a plurality of the electronic components 30 is reduced compared with a configuration in which electronic components are mounted on only one substrate surface. Accordingly, it is possible to reduce the size of the circuit substrate 20 and thus the size of the electric device 10 while suppressing an increase in the mounting density of the electronic components 30.

The content of dust particles per unit volume of the liquid insulating-and-cooling medium 40 in the electric device 10 according to the present embodiment is lower than the content of dust particles per unit volume of air.

With the configuration according to the present embodiment, the amount of dust particles floating in the case 11 is reduced compared with an electric device that has a conventional configuration in which a case is not filled with the liquid insulating-and-cooling medium 40, and the probability of short-circuiting occurring due to dust particles is reduced. Accordingly, it is possible to increase the mounting density of the electronic components 30, and reduce the size of the electric device 10, compared with a conventional configuration.

In the electric device 10 according to the present embodiment, the case 11 is made of a material that contains a metal.

With the configuration according to the present embodiment, the case 11 has high heat conductivity, and, as a result, heat transferred from the electronic components 30 to the liquid insulating-and-cooling medium 40 is likely to be transferred from the liquid insulating-and-cooling medium 40 to the case 11, and be further transferred to the outside. Accordingly, heat dissipation of the electric device 10 is increased, and an increase in the temperature of the electric device 10 is suppressed.

In the electric device 10 according to the present embodiment, a flow path through which the liquid insulating-and-cooling medium 40 can flow is formed between the case 11 and the electronic components 30.

With the configuration according to the present embodiment, as a result of the liquid insulating-and-cooling medium 40 flowing between the case 11 and the electronic components 30, the liquid insulating-and-cooling medium 40 is favorably convected in the case 11, and the thermal dispersion is improved. In addition, as a result of the liquid insulating-and-cooling medium 40 flowing along the case 11, heat is likely to be transferred from the liquid insulating-and-cooling medium 40 to the case 11, and the heat dissipation is improved. Accordingly, an increase in the temperature of the electric device 10 is suppressed.

The electric device 10 according to the present embodiment further includes the busbar 51 that is formed in a flat plate shape, and contains a metal, and the busbar 51 and the electronic components 30 are connected to each other via metal members formed containing a metal.

With the configuration according to the present embodiment, heat from the electronic components 30 is transferred to the busbar 51 via the metal members that have high heat conductivity such as conductive paths that include the lands 52. The heat transferred to the busbar 51 is then transferred from the surfaces of the busbar 51 that have high heat conductivity and large specific surface areas, to the liquid insulating-and-cooling medium 40. Accordingly, the heat generated by the electronic components 30 is promptly transferred to the liquid insulating-and-cooling medium 40, thus improving the thermal dispersion and the heat dissipation of the electric device 10.

The busbar 51 in the electric device 10 according to the present embodiment has an elongated shape that is long in one direction, and is disposed such that the longitudinal direction thereof matches the vertical direction.

With the configuration according to the present embodiment, heat transferred to the busbar 51 is transferred upward from below as well as inside the busbar 51 that has high heat conductivity, and is distributed. Accordingly, the thermal dispersion in the electric device is further improved.

The busbar 51 in the electric device 10 according to the present embodiment is disposed in an orientation in which the plate surfaces of the busbar 51 are perpendicular to the substrate surface 20A of the circuit substrate 20.

With the configuration according to the present embodiment, the liquid insulating-and-cooling medium 40 flows while being guided by the substrate surface 20A of the circuit substrate 20 and the plate surfaces of the busbar 51, and the flow of the liquid insulating-and-cooling medium 40 is corrected. Accordingly, convection of the liquid insulating-and-cooling medium 40 in the case 11 is smoother, thus improving the thermal dispersion and the heat dissipation of the electric device 10.

Other Embodiment

The present disclosure is not limited to the embodiment described based on the description above and the drawings, and embodiments such as those described below are also included in the technical scope of the technique disclosed in the present description.

(1) The electronic components 30 are not limited to those described above. The sizes, shapes, and arrangement of the electronic components 30 described in the above embodiment and the number of electronic components 30 are also merely examples.

(2) The circuit substrate 20 is not limited to that disposed as described above. In the above embodiment, the circuit substrate 20 is disposed on the rear side in the front-and-rear direction of the case 11, and the electronic components 30 that generate relatively large amounts of heat are mounted on the substrate surface 20A that is the plate surface on the front side of the circuit substrate 20. A configuration may also be adopted in which the circuit substrate is disposed at the center in the front-and-rear direction in the case, and the electronic components 30 that generate large amounts of heat are arranged on one substrate surface and the other substrate surface, namely both of the two substrate surfaces in a dispersed manner, for example.

(3) The circuit substrate 20 and the case 11 are not limited to those having the above sizes and shapes. In the above embodiment, the circuit substrate 20 and the case 11 having vertically elongated shapes in which the height in the up-down direction is larger than the width in the right-left direction were described. A circuit substrate and a case having horizontally elongated shapes in which the width in the right-left direction is larger than the height in the up-down direction may also be used, for example. With such a configuration, the contact area of the liquid insulating-and-cooling medium and the lid body is increased, and heat dissipation via the lid body is further improved.

(4) The shape and position of the busbar 51 and the number of busbars 51 are not limited to those described above. A plurality of busbars may be disposed on one substrate surface and the other substrate surface, namely both of the two substrate surfaces of the circuit substrate, for example. In addition, a plurality of busbars may be disposed on one or both of the substrate surfaces of the circuit substrate, so as to be aligned in parallel and extend in the vertical direction with a space therebetween in the right-left direction. With such a configuration, it is possible to further correct the flow of the liquid insulating-and-cooling medium.

(5) The electric device 10 is not limited to that including a DC-DC converter. This technique can also be applied to an AC-DC converter, an electrical junction box, a power distribution box, an ECU, and the like.

LIST OF REFERENCE NUMERALS

10 Electric device (DC-DC converter)
11 Case
11L Lid body
11M Main body
20 Circuit substrate
20A, 20B Substrate surface
30 Electronic component
31 FET
31A High voltage side FET
31B Low-voltage side FET
31L Terminal portion
31M Main body portion
32 Transformer
33 Coil
33A Resonance coil
33B Choke coil
40 Liquid insulating and cooling medium
51 Busbar
52 Land

The invention claimed is:

1. An electric device comprising:
a case;
a circuit substrate that is disposed in the case; and
a plurality of electronic components that are disposed in the case, and generate different amounts of heat when energized,
wherein the case is filled with a liquid insulating-and-cooling medium,
the circuit substrate is disposed in an orientation in which a normal line of a substrate surface that is a plate surface of the circuit substrate is horizontal, and
the plurality of electronic components are disposed in the case such that the different amounts of heat generated by the plurality of electronic components when energized decrease upward from below, and are immersed in the liquid insulating-and-cooling medium,
wherein the plurality of electronic components are disposed such that a total amount of heat generated by electronic components positioned below ½ of an inner height of the case in an up-down direction accounts for 70% or more of an amount of heat generated by all of the plurality of electronic components when energized.

2. The electric device according to claim 1,
wherein the plurality of electronic components are mounted on each of two substrate surfaces of the circuit substrate.

3. The electric device according to claim 1,
wherein a content of dust particles per unit volume of the liquid insulating-and-cooling medium is lower than a content of dust particles per unit volume of air.

4. The electric device according to claim 1,
wherein the case is formed of a material that contains a metal.

5. The electric device according to claim 1,
wherein a flow path through which the liquid insulating-and-cooling medium is able to flow is formed between the case and the plurality of electronic components.

6. The electric device according to claim 1,
wherein the busbar has an elongated shape that is long in one direction, and is disposed such that a longitudinal direction thereof matches a vertical direction.

7. The electric device according to claim 6,
wherein the busbar is disposed in an orientation in which a plate surface of the busbar is perpendicular to the substrate surface of the circuit substrate, and
a flow path for the liquid insulating-and-cooling medium is formed extending in the vertical direction along the substrate surface of the circuit substrate and the plate surface of the busbar.

8. The electric device according to claim 6,
wherein the busbar extends between the plurality of electronic components in the vertical direction.

* * * * *